US006791046B1

(12) United States Patent
King

(10) Patent No.: US 6,791,046 B1
(45) Date of Patent: Sep. 14, 2004

(54) SWITCH ASSEMBLY

(76) Inventor: Corey T. King, 6921 $164^{th}$ St. SE., Snohomish, WA (US) 98296

( * ) Notice: Subject to any disclaimer, the term of this patent is extended or adjusted under 35 U.S.C. 154(b) by 8 days.

(21) Appl. No.: 10/156,901

(22) Filed: May 28, 2002

(51) Int. Cl.[7] .......................... H01H 9/02; H01H 13/76; H05K 5/00; H05K 1/11; H01R 12/16

(52) U.S. Cl. ....................... 200/293; 200/303; 200/307; 200/520; 174/52.1; 361/789; 361/803

(58) Field of Search ............................. 174/52.1–65 G; 200/293–307, 520–536; 361/784, 785, 789, 803

(56) References Cited

U.S. PATENT DOCUMENTS 2,010,233 A * 8/1935 Hopkins et al. ............ 200/520
2,307,258 A 1/1943 De Smidt et al.
2,897,327 A 7/1959 De Smidt et al.
3,200,227 A 8/1965 Karch
3,419,696 A 12/1968 Bailey et al.
3,446,467 A 5/1969 Bailey et al.
3,453,408 A 7/1969 Muné
3,597,564 A 8/1971 Lewis
3,668,324 A 6/1972 Firestone
3,723,689 A 3/1973 Wenzel
3,953,699 A 4/1976 Scheibel et al.
3,954,320 A 5/1976 Hardesty
4,050,768 A 9/1977 Gumb
4,051,665 A 10/1977 Arn
4,071,696 A 1/1978 Anderson
4,131,772 A * 12/1978 Weckenmann et al. .. 200/61.54
4,163,882 A 8/1979 Baslow
4,202,593 A 5/1980 Abernethy et al.
4,392,701 A 7/1983 Weidler
4,497,526 A 2/1985 Myers
4,602,842 A 7/1986 Free et al.
4,737,751 A * 4/1988 Risk ........................... 335/207
4,977,300 A 12/1990 Schroeder
5,128,828 A 7/1992 Mrenna et al.
5,229,545 A 7/1993 Good
5,461,542 A * 10/1995 Kosak et al. ............... 361/710

FOREIGN PATENT DOCUMENTS

JP 2201825 8/1990

OTHER PUBLICATIONS

Diebold, #19–012080–0–00A Double Squeeze Holdup Button Assembly, photos, Jan. 1, 1991.
HUB I., HUB II., Hold Up Button, photos, Jan. 1, 1991.
LeFebure, #T–4605 Two–Finger Hold–Up Switch, photos, Jan. 1, 1991.
Mosler, #05269G01REVAB, photos, Jan. 1, 1991.
Mosler, Two Finger Alarm Switch, photos, Jan. 1, 1991.
Potter, HUB–M, #2020130, photos, Jan. 1, 1991.
Potter, HUB–T, #2020132, photos, Jan. 1, 1991.
Rothenbuhler, Switch #4050, photos, Jan. 1, 1991.
UltraTech Power Products, 1M–RJ31XSET 01.11, phone jack, photos, Jan. 1, 1991.

* cited by examiner

*Primary Examiner*—J. R. Scott
(74) *Attorney, Agent, or Firm*—Christensen O'Connor Johnson Kindness PLLC

(57) ABSTRACT

A switch assembly is described having one or more switches and a holder. The switches are preferably of a pushbutton type having an outwardly extending flange. The holder includes a cover and base with a pair of upright arms. The cover includes a three-sided opening. As assembled, the upright arms receive a switch and the combination is received in the three-sided opening of the cover. A switch subassembly is further described having a circuit board and quick-disconnect unit. Such improved switch and switch subassembly allow a technician to quickly change out a defunct alarm system switch.

30 Claims, 5 Drawing Sheets

Fig.4.
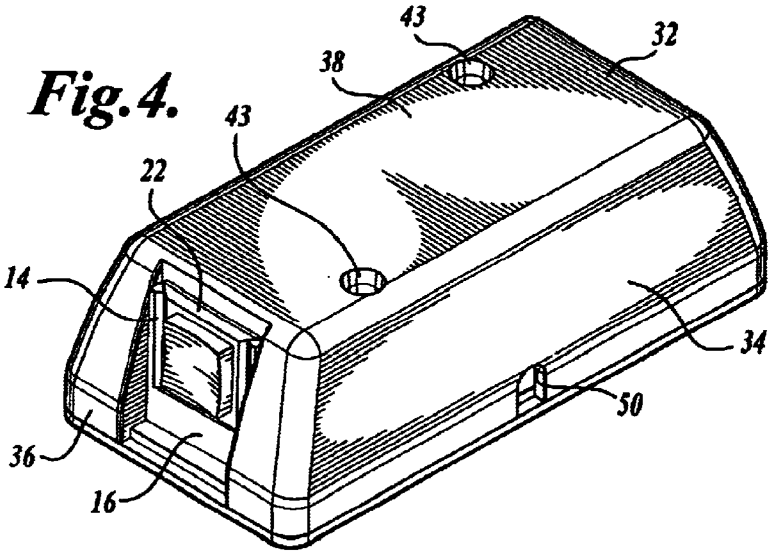
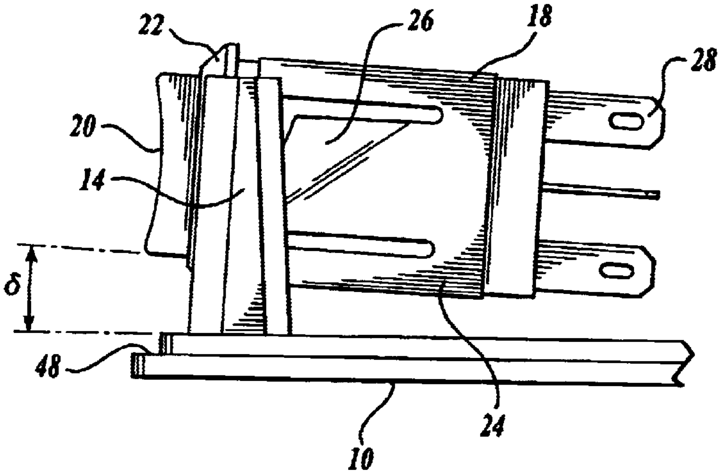
Fig.5.
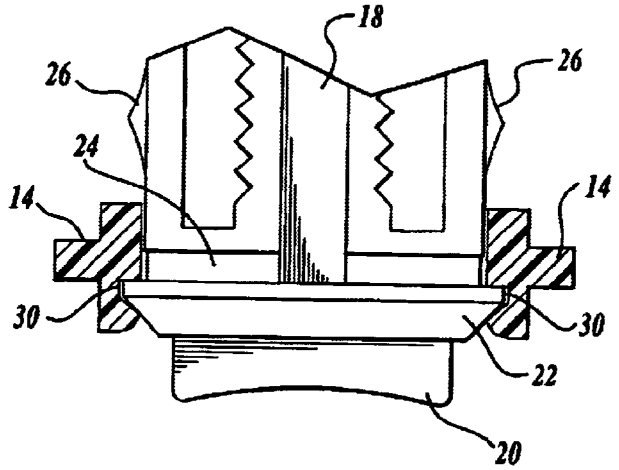
Fig.6.

SWITCH ASSEMBLY

FIELD OF THE INVENTION

The present invention relates to electricity conductors and insulators and, more particularly, to electric device boxes and housings and mounting means therefor.

BACKGROUND OF THE INVENTION

The ability to quickly repair or replace a defunct switch is a highly desirable characteristic in many applications. For example, in bank alarm systems, switches are typically used to trigger an alarm or turn on a camera, e.g., at each teller station. It is not unusual for each switch to be in a constantly activated state in which it is always carrying an electric current. If the current is interrupted, such as when the switch is pressed or fails, or when the switch's wiring is cut, then the alarm is sounded. In the event that a switch fails and a false alarm is sounded, the entire alarm system is typically shut down until the faulty switch can be found and repaired or replaced. It is, therefore, desirable to have a switch that can be repaired or replaced in a minimum amount of time.

Currently, it is known to reduce the risk of false alarms by using a pair of switches at each station. The pair of switches, which are usually of a pushbutton type, are placed opposite one another within a single case or housing such that a person would normally have to use two fingers to activate the alarm. In this manner, if one switch is accidentally pushed, the alarm will not sound. Such switches and their associated housing are generally referred to as "two-finger switches." If a two-finger switch becomes defunct, technicians generally prefer to replace both switches in order to quickly restore the alarm system to its activated state. This eliminates the time required to determine which of the switches is actually broken.

U.S. Pat. No. 5,229,545 describes a switch holder housing for an alarm system two finger switch. The holder includes a cover and a planar base. The cover has a number of side panels, one of which includes a three-sided rectangular opening. When assembled, the opening receives the switch. Mounting means are included to connect the cover with the base. The base includes an abutment member that extends upwardly from the base's upper surface. The switch is held in position within the opening by the abutment member when the cover is mounted to the base. Wiring is soldered between the two switches. Incoming wiring is soldered to each switch as well.

The '545 device has a number of disadvantages. When replacing a worn switch, the existing wiring must be cut from the worn switch and resoldered to a new switch pair. The connected pair is then inserted into the housing and reinstalled at the work surface. The '545 device is difficult to repair because connecting incoming wiring to a switch generally takes two hands, leaving no hands available to hold the switch itself. Alternatively, the installer can insert the new switch pairs into the openings of the cover prior to reconnecting the incoming wiring. This approach stabilizes the switches; however, it makes it much more difficult for the installer to resolder the connections because the switches are cramped within the inner volume of the cover.

Further, the '545 device, as well as a number of other known two-finger switches, require a technician to fully understand the customer's underlying alarm system in order to be able to properly install the replacement switches. Some alarm systems operate in a normally closed configuration (as described above, in which current is always provided in a switch, and the alarm system is tripped when the current is interrupted). These setups are referred to as "normally closed". Others operate in a normally open configuration (in which current is not normally present in a switch, and the alarm system is tripped when current is present). These setups are referred to as "normally open". In addition, two-finger switches can be used to activate two separate aspects of the alarm system. For example, pressing one switch may activate a camera, while simultaneously pressing both switches may activate a silent alarm. The wiring to these different functions can be either both normally open, both normally closed, or one open and the other closed. As one can appreciate, this requires the technician to understand the alarm system and take care in installing the switch correctly, both of which are disadvantageously time consuming.

Thus, a need exists for an improved switch arrangement. Ideally, such a switch would be easy to manufacture, easy to install, and easy to replace. The present invention is directed to fulfilling these needs and others as described below.

SUMMARY OF THE INVENTION

In accordance with the teachings of the present invention, a switch assembly is described having one or more switches and a holder. The switches are preferably of a pushbutton type having an outwardly extending flange. The holder includes a cover and base with a pair of upright arms. The cover includes a three-sided opening. As assembled, the upright arms receive a switch and the combination is received in the three-sided opening of the cover.

In accordance with aspects of this invention, one embodiment is described in which the switch includes a protrusion extending from its main body. As assembled, at least portions of the arms are longitudinally maintained between the protrusion and the flange. In another embodiment, the pair of arms each includes an inwardly oriented channel. As assembled, the switch flange is held in the arm channels.

In accordance with other aspects of this invention, a switch subassembly is described for connection to incoming electrical wiring in a two-finger switch. The subassembly includes a pair of circuit boards. A switch and a quick-disconnect unit are attached to each board. Interconnecting wiring is mounted between the circuit boards, so that no further wiring between the switches is necessary when installing the subassembly in a switch holder.

BRIEF DESCRIPTION OF THE DRAWINGS

The foregoing aspects and many of the attendant advantages of this invention will become more readily appreciated by reference to the following detailed description, when taken in conjunction with the accompanying drawings, wherein:

FIG. 4 is a perspective view of another embodiment of a switch assembly formed in accordance with the present invention;

FIG. 5 is a partial side view of the base of FIG. 4 holding a switch;

FIG. 6 is a cross-sectional view of a base holding a switch;

DETAILED DESCRIPTION OF THE PREFERRED EMBODIMENT

In general, a switch assembly formed in accordance with the present invention includes a holder and one or more switches housed within the holder. The holder has a base and a cover, which may be joined together, either prior to installation or as part of the installation process. The holder is made from any suitable material, a preferred material being a molded elastomer or the like. According to one aspect of the present invention, the switches are held by support members that are located at each end of the base. According to another aspect of this invention, all electrical connections going between switches within the holder are accomplished prior to installation of the switches in the holder. During assembly, an installer can thereby quickly attach the switches to the support members, having eliminated the need to electrically interconnect switches. The installer's hands are also free to connect incoming wiring to the secured switches and to then mount the entire unit to a work surface. Removal of the switches is easily accomplished in reverse order.

Figure 3:
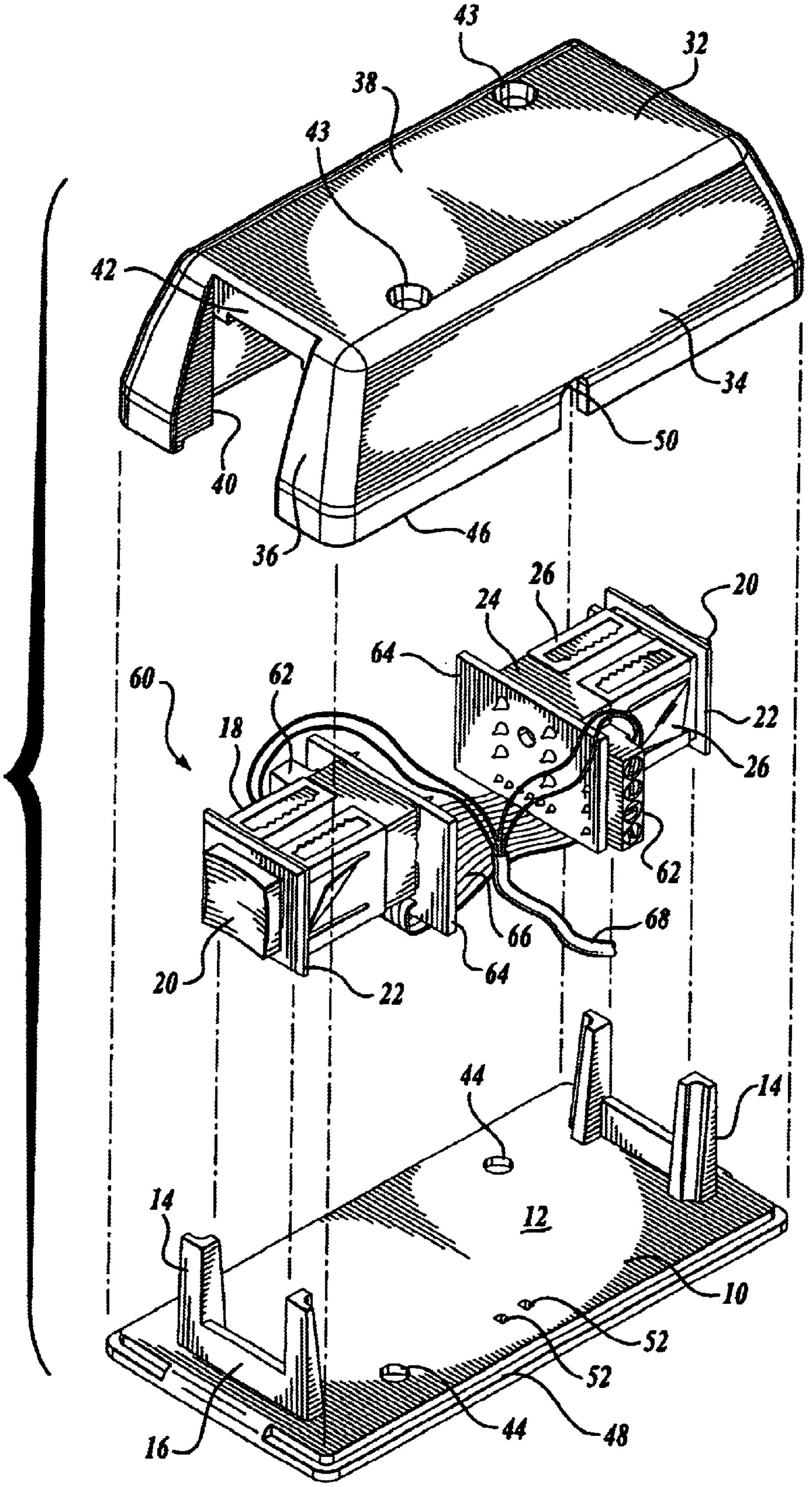
FIG. 3 is a perspective view of the switch assembly of FIG. 1, shown in exploded view.

In one embodiment and referring first to FIG. 3, the mounting base 10 is a generally planar rectangular object having an interior mounting surface 12, opposed sides, and opposed ends. The support members are formed in this embodiment as a pair of arms 14 extending upwardly from the mounting surface 12, near the comers of each base end. An optional lower upright support member 16 may be provided between the arms 14, either extending the full distance or some partial distance therebetween.

The present invention preferably uses a pushbutton switch 18, such as that described in U.S. Pat. No. 3,446,467, or the like. The switch 18 includes a pushbutton 20 surrounded by an outer flange 22 and extended from a main body 24. Optional leaf springs 26 extend outwardly from the sides of the body 24. Terminals 28 extend from the rear of the body 24. When such a two-finger switch 18 is used, it is installed in the base 10 by having its body 24 slid into the upright arms 14. This sliding motion may be accomplished by positioning the switch 18 directly above the upright arms 14 and squeezing the leaf springs 26 flush with the main body surface while simultaneously pushing the switch 18 downward and into the arms 14. Alternatively, the switch 18 may be positioned above and outward of the arms 14 so that the tips of the arms first contact the body 24 at a location aft of the leaf springs 26. Once the switch 18 is held in the arms 14, the switch is then slid horizontally inward into the arms so that the arms are adjacent the switch outer flange 22. As installed, the base arms 14 are located substantially between the outer flange 22 and the leaf springs 26. A portion of the leaf springs 26 may be held within the arms, depending on their size and/or the location of the leaf springs. In some switches, the leaf springs 26 are rearwardly adjustable. Thus, it is possible to position the spring completely rearward of the flange 22. See FIG. 6.

Figure 7:
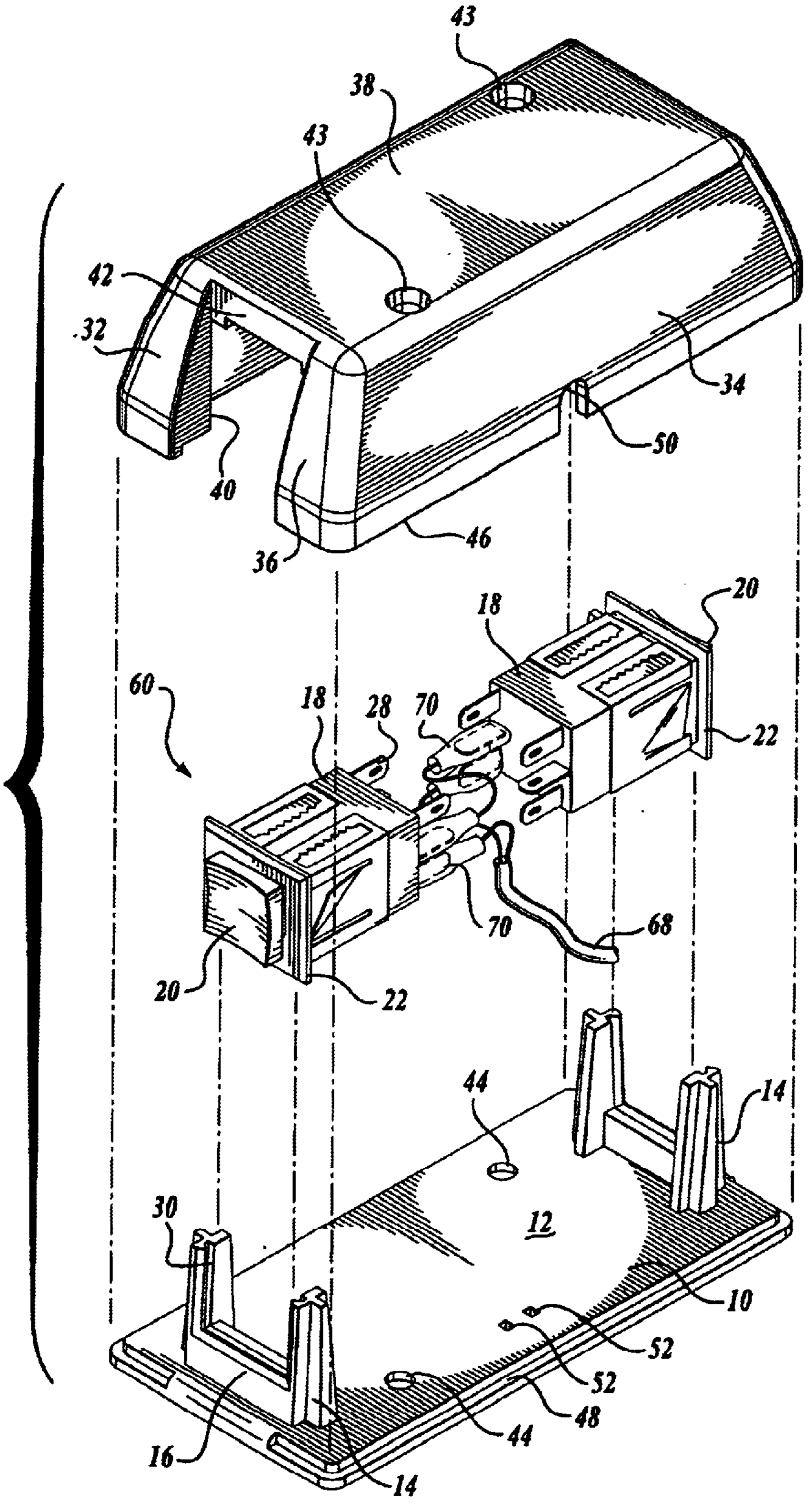
FIG. 7 perspective view of the switch assembly of FIG. 4, shown in exploded view.

FIG. 7 illustrates a second embodiment of a support member formed also as a pair of arms 14. The arms of FIG. 7, however, include a channel 30 located along their inner edges. The lower upright support member (if present) may also include such a channel. To assemble, the installer slides the outer flange 22 of the switch 18 downward and into these channels 30. See FIGS. 4 and 6. As will be appreciated from a reading of the above, other arrangements of support members are possible and are within the scope of the present invention. Such arrangements, in general, are capable of holding a switch in a stationary manner to the base 10. For example, the arms 14 may be positioned on the base so that the arms hold the switch at a position much farther aft of the flange 22.

Referring to FIGS. 3 and 7, the cover 32 is generally rectangular in shape. The cover 32 includes opposed side panels 34, opposed end panels 36, and a connecting top panel 38. These panels are preferably joined with rounded corners in order to discourage unintended catching of a garment or other object when the switch is installed. An opening 40 is located in each end panel of the cover 32. Each opening 40 is three-sided and is sized to expose the pushbutton 20 of a switch when the base 10 and cover 32 are joined together. In the embodiment shown, each opening 40 is sized smaller than the total end panel area. Alternatively, the cover 32 may be formed such that an opening 40 completely replaces an end panel 36, and the support member of the mounting base is enlarged. In this way, the enlarged support member closes out the end of the cover when the cover 32 and base 10 are joined. An optional upper connecting wall 42 may be used along the end panel opening 40 to provide further support to the switch 18. Alternatively, the thickness of the top panel 38 itself may be sufficient to support portions of the switch flange 22.

The cover 32 is connected to the mounting base 10 using one of a number of known means. In one embodiment and referring to FIG. 3, the cover 32 includes a pair of holes 43 that align with openings 44 in the base 10. Threaded fasteners (not shown) insert into the cover 32 and pass through the base openings 44 to screw into the desired work surface (not shown). Thus, the cover 32 is pressed against the base 10 and held in place by the fasteners connecting the assembly to the work surface. Optional downwardly extending tubes (not shown) in the cover 32 may be used to guide the screws to the base openings 44 and transfer forces between the cover 32 and the base 10. In another embodiment, the lower edge 46 of the cover 32 is shaped and sized to fit snugly onto a receded edge 48 of the base periphery. In yet another embodiment, mating tabs and notches (not shown) may be used to connect the cover with the base. As will be appreciated by those skilled in the art, numerous other types of connecting means are known and may be used.

An opening is provided in the base 10 and/or the cover 32 to provide wire access or inspection means. In the arrangement of FIG. 3, a hole 50 is located along the lower edge 46 of the cover. In addition, the base 10 may include tie-down holes 52 by which the incoming wiring is secured to the base using a conventional tie (not shown).

As stated above, electrical connections are provided between the switches 18 and incoming wiring, and between the switches themselves. The combination of switches and wiring is generally referred to herein as a switch subassembly 60. Two embodiments of wire connections are described below. In either arrangement, the installer can easily access and quickly install the electrical connections.

Figure 2:
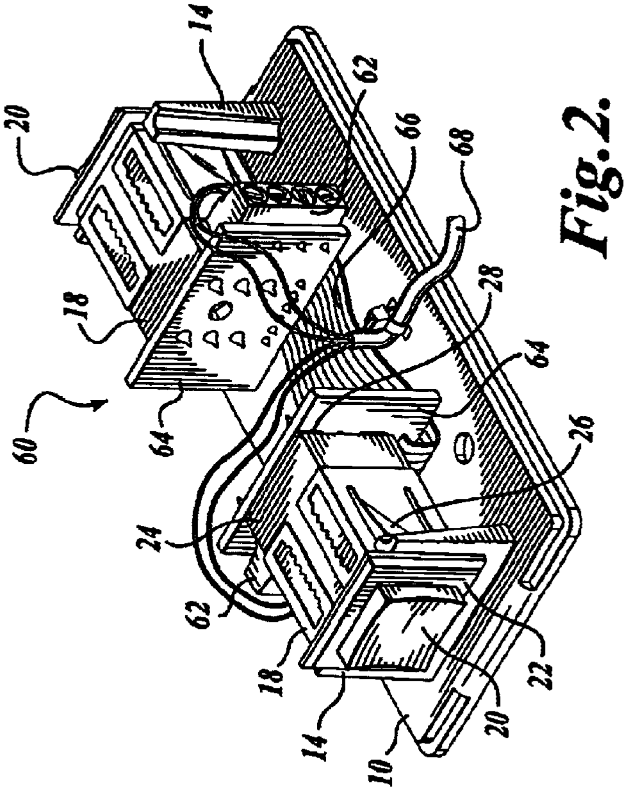
FIG. 2 is a perspective view of the switch assembly of FIG. 1, without a cover.
Figure 1:
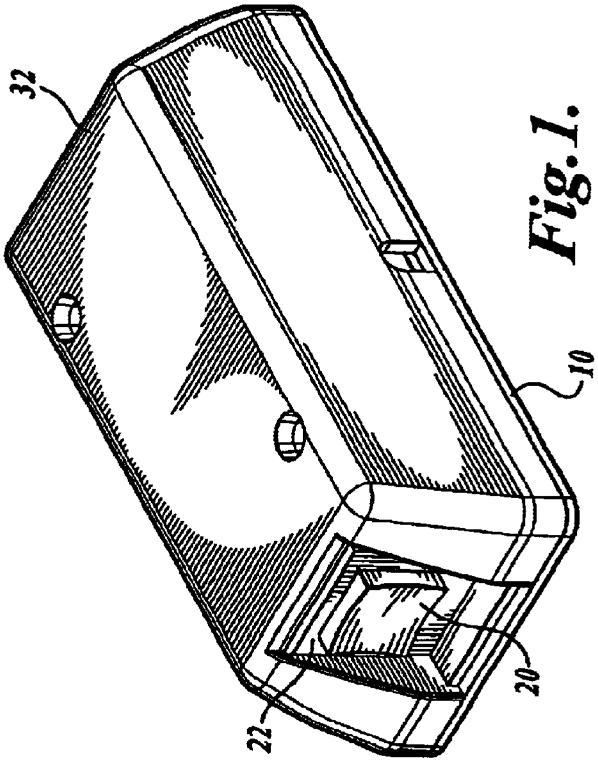
FIG. 1 is a perspective view of one embodiment of a switch assembly formed in accordance with the present invention.

In one embodiment shown in FIGS. 2 and 3, the electrical connections are accomplished using a circuit assembly in which a switch 18 and a quick-disconnect unit 62 are attached to a preformed printed circuit board 64. If more than one switch is used, a connecting wiring band 66 interconnects the boards 64. For example, band 66 is shown as a multiconductor ribbon cable. The disconnect unit 62 is a known object that may be purchased from available manufacturers; see, for example, the Entrelec Company, Part Number 0033 054 15. The circuit board 64 includes a layout that provides the necessary connections between the switch, the disconnect unit, the other switch, and the incoming wires 68. Such layout will vary according to the needs of a particular application.

According to one method of manufacture, multiple circuit assemblies are formed by first preparing a single large printed circuit board with the necessary openings and electrical layout connections. The printed circuit board is scored so that the circuit assemblies, or pairs of assemblies if preparing a two-finger switch 18, may be easily separated once the various components are attached. Switches and quick-disconnect units (and interconnecting wiring bands if appropriate) are inserted into their respective openings in the board. The combination is put through a flow solder machine. Once soldered, the board is cleaned to remove excess flux. The board is then passed over a router to clip off the leads on the backside of the board. The board is then broken along its scores to form the circuit assemblies.

In the two-finger switch, the switch subassembly is installed in the holder by insertion of the switches 18 into the mounting base 10 as described above. The assembly is prevented from any substantial movement by the securement of the switches at the support members. Since the wiring between the switches was completed in the forming of the subassembly, there is no need to bother with interconnecting wires between switches once they are placed in the support members. The technician then connects the incoming wiring to proper quick-disconnect ports. The support members hold the switch 18 stable making it easy to use both hands to connect the incoming wiring. This is not true in prior art devices where the installer had to hold a switch while simultaneously trying to solder the interconnecting wiring. For the deft, the incoming wiring alternatively may be connected to the assemblies prior to installing them in the support members. Lastly, the cover 32 and base 10 are joined and installed at the desired work surface. When the cover is in place, the support members hold their respective switches in place and provide rigidity to each switch mount.

In FIG. 7 a second embodiment of electrical connections is described in which wiring is connected to the terminals 28 of the switches using conventional spade lugs 70. The connections between dual switches are preferably accomplished prior to engaging the switches in the support members. In this embodiment, and as above, the connections of the incoming wiring to the switches may also be accomplished either before or after the switches are secured to the support members.

Figure 8:
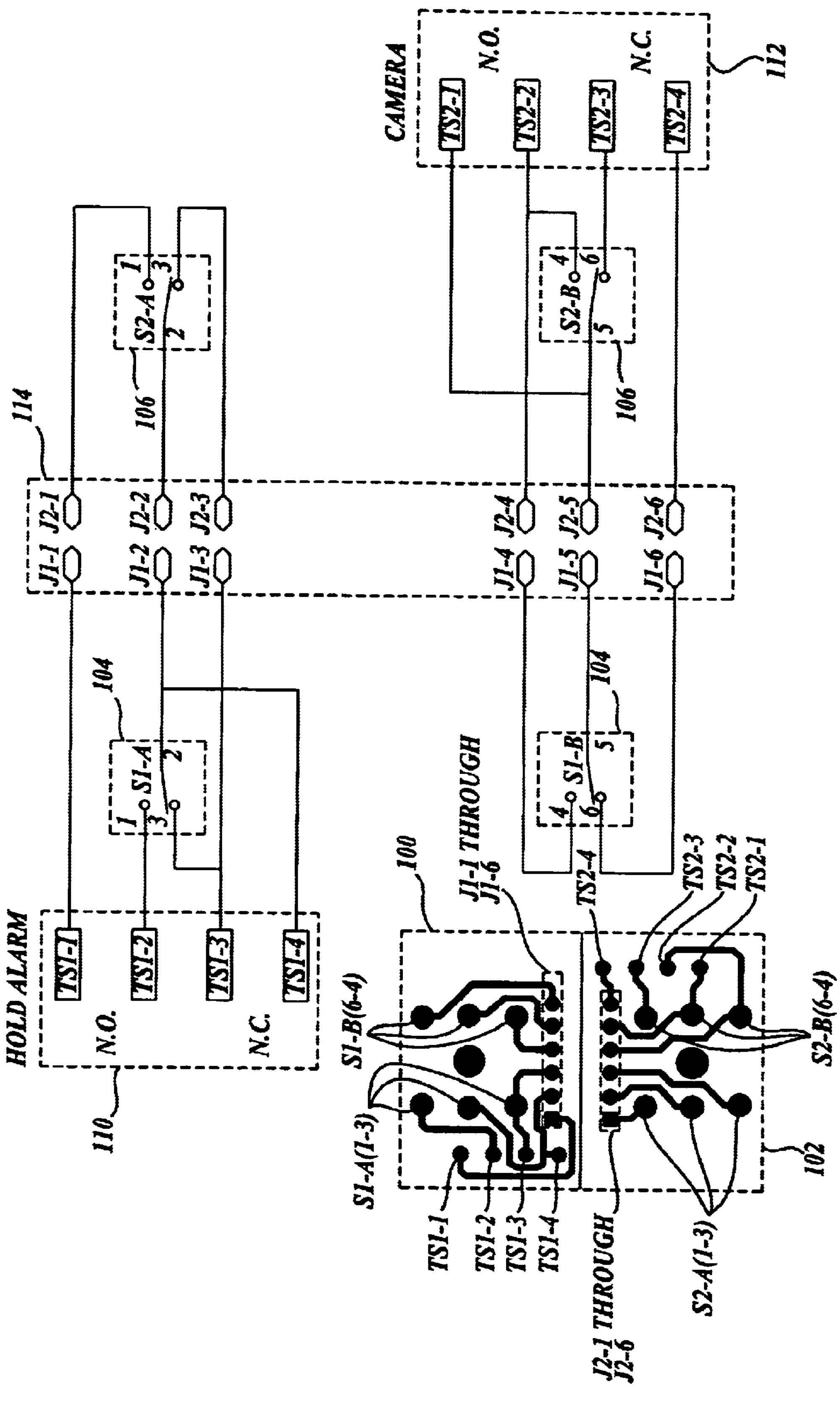
FIG. 8 is a diagram illustrating one embodiment of an electrical schematic and layout for a printed circuit board formed in accordance with the present invention.

Referring to FIG. 8, the circuit boards of a two-finger switch may be made to accomplish any number of tasks. In one embodiment, the boards are configured for use in a commercial alarm system. The two-finger switch triggers either a hold-up alarm (e.g., a silent internal alarm, police contact, etc.) or a video camera. In such systems, pressing both switches simultaneously triggers the silent alarm. Pressing either single switch triggers the camera, without triggering the silent alarm. The electrical schematic of FIG. 8 can be used with alarm systems that are normally open (for both or either function) or normally closed (for both or either function).

In FIG. 8, first and second circuit boards, 100 and 102, respectively, are formed to accommodate first and second switches, 104 and 106, respectively. The switches are assumed to be in a primary, unpressed state. The switch arms labeled S1-A and S1-B move to their secondary position when the switch pushbutton is depressed. Each switch 104 and 106 includes six leads, labeled 1–6 in FIG. 8. A first quick-disconnect unit 110 is for use with the first board 100. A second quick-disconnect unit 112 is for use with the second board 102. Each unit 110 and 112 is provided with four terminals. The first unit terminals are labeled TS1-1, TS1-2, TS1-3, and TS1-4. Likewise, the second unit 112 is provided with similar terminal labeling. Which terminals are used depends on whether the alarm system is normally open ("N.O.") or normally closed ("N.C."). A cable ribbon 114 interconnects the terminals J1-1 through J1-6 of the first board 100 with the terminals J2-1 through J2-6 of the second board 102.

As will be appreciated from a reading of the above, using the preformed and preconnected switch subassembly greatly reduces the amount of time needed to install or repair a switch. Very little time is needed to simply insert the switches into the support members and connect the incoming wiring to the quick-disconnect units. Further, no soldering is required whatsoever. In addition, the use of a preformed circuit layout capable of accomplishing any of a number of intended switch functions, greatly reduces the amount of time needed for a technician to install or repair the switch. It also reduces the likelihood of error in the installation.

While the preferred embodiment of the invention has been illustrated and described, it will be appreciated that various changes can be made therein without departing from the spirit and scope of the invention as claimed.

What is claimed is:

1. A switch assembly comprising:

(a) at least one switch having a main body and a button extending therefrom; the body including an outwardly extending flange that surrounds the button; the body further including at least one protrusion extending outwardly from the body at a location aft of the flange; and (b) a holder for use in holding the at least one switch, the holder including (i) a cover with a top panel, a number of side panels, and an open bottom; at least one of the side panels including a three-sided opening; and (ii) a base with a mounting surface and a pair of arms extending upwardly from the mounting surface, the arms being oriented to face one another and placed apart a distance that is less than the size of the switch at the flange;

wherein, as assembled, the arms slidingly receive the switch by insertion of the switch body between the pair of arms, at least portions of the arms being longitudinally maintained between the protrusion and the flange; the base and cover then being joined to form the holder, the combination of switch and arms being received in the three-sided opening.

2. The switch assembly according to claim 1, wherein the base further includes an upright lower support member located between the pair of arms; wherein, as assembled, the lower support member contacts the switch and maintains the switch at a predetermined height.

3. The switch assembly according to claim 1, wherein the pair of arms is canted inward an amount less than about 5 degrees.

4. The switch assembly according to claim 1, wherein the pair of arms is sized to completely close out the three-sided opening of the cover when the cover and base are joined.

5. The switch assembly according to claim 1, wherein the three-sided opening is sized smaller than the total area of the side panel within which it is formed.

6. The switch assembly according to claim 1, wherein the distance between the arms is substantially the same as the size of the switch body so that as assembled the body is frictionally held between the arms.

7. The switch assembly according to claim 1, wherein the at least one switch includes first and second switches and the base includes a second pair of arms to hold the second switch; the switch assembly further including interconnecting wiring between the switches.

8. The switch assembly according to claim 7, wherein spade lugs are used to attach the interconnecting wiring to at least one of the switches.

9. The switch assembly according to claim 1, wherein the three-sided opening includes two side edges and a top edge, the top edge falling short of the top panel so that a small portion of the side panel is available to help support the switch flange as assembled.

10. The switch assembly according to claim 1, wherein the protrusion is a leaf spring.

11. The switch assembly according to claim 1, wherein the switch is slid laterally into the pair of arms.

12. The switch assembly according to claim 1, wherein the switch is slid vertically down into the pair of arms.

13. The switch assembly according to claim 1, wherein each arm includes an inner edge and a channel located therein; the arms being oriented such that the channels of the arms face one another, the channels being placed apart a distance corresponding to the size of the switch at the flange; wherein, as assembled, the arms slidingly receive the switch by insertion of the switch flange into the arm channels.

14. A switch assembly comprising:

(a) at least one switch having a main body and a button extending therefrom, the body including an outwardly extending flange that surrounds the button;

(b) a holder for use in holding the at least one switch, the holder including (i) a cover with a top panel, a number of side panels, and an open bottom; at least one of the side panels including a three-sided opening; and (ii) a base with a mounting surface and a pair of arms extending upwardly from the mounting surface, each arm including an inner edge and a channel located therein; the arms being oriented such that the channels of the arms face one another, the channels being placed apart a distance corresponding to the size of the switch at the flange;

wherein, as assembled, the arms slidingly receive the switch by insertion of the switch flange into the arm channels; the base and cover then being joined together to form the holder, the combination of switch and arms being received in the three-sided opening of the cover.

15. The switch assembly according to claim 14, wherein the base further includes an upright lower support member located between the pair of arms; wherein, as assembled, the lower support member contacts the switch and maintains the switch at a predetermined height.

16. The switch assembly according to claim 15, wherein the lower support member also includes a channel for receipt of the switch flange.

17. The switch assembly according to claim 14, wherein the pair of arms is canted inward an amount less than about 5 degrees.

18. The switch assembly according to claim 14, wherein the pair of arms is sized to completely close out the three-sided opening of the cover when the cover and base are joined.

19. The switch assembly according to claim 14, wherein the three-sided opening is sized smaller than the total area of the side panel within which it is formed.

20. The switch assembly according to claim 14, wherein the distance between the arm channels is substantially the same as the size of the flange so that the flange is frictionally held within the channels.

21. The switch assembly according to claim 14, wherein the at least one switch includes first and second switches and the base includes a second pair of arms to hold the second switch; the switch assembly further including interconnecting wiring between the switches.

22. The switch assembly according to claim 21, wherein spade lugs are used to attach the interconnecting wiring to at least one of the switches.

23. The switch assembly according to claim 14, wherein the three-sided opening includes two side edges and a top edge, the top edge falling short of the top panel so that a small portion of the side panel is available to help support the switch flange as assembled.

24. The switch assembly according to claim 14, wherein the cover and base are both formed of a molded elastomer.

25. An improvement to a two-finger switch for connection to incoming electrical wiring in an alarm system, the two-finger switch having a pair of pushbutton switches and a holder; the improvement comprising a switch subassembly including:

(a) a pair of circuit boards, one switch being mounted on each board;

(b) a pair of quick-disconnect units, one unit also being mounted on each board; and (c) interconnecting wiring mounted between the circuit boards; the circuit boards, quick-disconnect units, and interconnecting wiring being formed prior to assembly of the two-finger switch and being made to accomplish a predefined task;

wherein to assemble the two-finger switch, the incoming wiring is connected to the quick-disconnect units, all wiring between the switches themselves being accomplished prior thereto.

26. A switch subassembly for connection to incoming electrical wiring in a two-finger switch; the subassembly comprising:

(a) a pair of switches;

(b) a pair of printed circuit boards having a circuit printed thereon, one switch being mounted on each board;

(c) a pair of quick-disconnect units, one unit also being mounted on each board; and (d) interconnecting wiring mounted between the circuit boards; the printed circuit boards, quick-disconnect units, and interconnecting wiring being made to accomplish a predefined task.

27. The switch subassembly according to claim 26, wherein the predefined task includes triggering a camera when a single switch is pressed and triggering a hold-up alarm when both switches are simultaneously pressed.

28. The switch subassembly according to claim 26, wherein the circuit boards, quick-disconnect units, and interconnecting wiring are assembled prior to assembly of the two-finger switch.

29. The switch subassembly according to claim 26, wherein the pair of switches are a pair of pushbutton switches.

30. The switch subassembly according to claim 26, wherein the interconnecting wiring is an insulated ribbon cable.

* * * * *